(12) United States Patent
Hagerup et al.

(10) Patent No.: US 7,994,801 B2
(45) Date of Patent: Aug. 9, 2011

(54) CALIBRATED S-PARAMETER MEASUREMENTS OF A HIGH IMPEDANCE PROBE

(75) Inventors: William A. Hagerup, Portland, OR (US); Laudie Doubrava, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 451 days.

(21) Appl. No.: 12/117,461

(22) Filed: May 8, 2008

(65) Prior Publication Data
US 2008/0278176 A1 Nov. 13, 2008

Related U.S. Application Data

(60) Provisional application No. 60/916,788, filed on May 8, 2007.

(51) Int. Cl.
*G01R 35/00* (2006.01)
*G01D 18/00* (2006.01)
(52) U.S. Cl. .......................... 324/601; 702/85
(58) Field of Classification Search .................. 324/638, 324/601; 702/90, 91, 85
See application file for complete search history.

(56) References Cited

U.S. PATENT DOCUMENTS

| | | | | |
|---|---|---|---|---|
| 5,047,725 A * | 9/1991 | Strid et al. | | 324/601 |
| 5,854,559 A * | 12/1998 | Miranda et al. | | 324/750.02 |
| 6,423,981 B1 * | 7/2002 | Nayler | | 257/48 |
| 6,480,013 B1 * | 11/2002 | Nayler et al. | | 324/750.02 |
| 7,019,535 B2 | 3/2006 | Adamian | | |
| 7,034,548 B2 * | 4/2006 | Anderson | | 324/600 |
| 7,124,049 B2 * | 10/2006 | Wong et al. | | 702/107 |
| 7,375,534 B2 * | 5/2008 | Kamitani | | 324/650 |
| 7,405,576 B2 * | 7/2008 | Kamitani | | 324/650 |
| 7,439,748 B2 * | 10/2008 | Kamitani | | 324/601 |
| 7,532,014 B2 * | 5/2009 | Chladek et al. | | 324/601 |
| 7,865,319 B1 * | 1/2011 | Jacobs et al. | | 702/57 |
| 2006/0181286 A1 * | 8/2006 | Adamian | | 324/601 |
| 2007/0041512 A1 * | 2/2007 | Pickerd et al. | | 379/30 |
| 2008/0036469 A1 * | 2/2008 | Chladek et al. | | 324/601 |

FOREIGN PATENT DOCUMENTS

US WO2008021907 A2 2/2008

OTHER PUBLICATIONS

D. Williams et al., "LMR Probe-Tip Calibrations uasing Nonideal Standards", 1995, IEEE Trans. Microwave Theory and Tech. 43, pp. 466-469.*
"Wideband Frequency-Domain Characterization of High-Impedance Probes," (U. Arz, H.C. Reader, P. Kabos, and D.F. Williams), 58th ARFTG Conference Digest, pp. 117-124, Nov. 29-30, 2001.
"Calibrated waveform measurement with high-impedance probes," (P. Kabos, H.C. Reader, U. Arz, and D.F. Williams), IEEE Trans. Microwave Theory and Tech., vol. 51, No. 2, pp. 530-535, Feb. 2003.

(Continued)

*Primary Examiner* — Timothy J Dole
(74) *Attorney, Agent, or Firm* — Thomas F. Lenihan

(57) ABSTRACT

A new methodology for the measurement of the S-parameters of a high impedance probe allows obtaining a full two port S-parameter set for the high impedance probe. The measured probe S-parameters are then used for characterization of probes. An alternative method characterizes half of the fixture and termination as a one-port network and expanding it into a two-port error box. The two-port error box is then cascaded with the probe input.

7 Claims, 12 Drawing Sheets

OTHER PUBLICATIONS

[0007] "Measuring the invasiveness of high-impedance probes," (U. Arz, P. Kabos, and D.F. Williams), 7th IEEE Workshop on Signal Propagation on Interconnects, Siena, Italy, May 11-14, 2003.

"Calibrating On-Wafer Probes to the Probe Tips," (D. F. Williams and R. B. Marks), 40th ARFTG Conference Digest, pp. 136-143, Dec. 1992.

[0010] "Multiport investigation of the coupling of high-impedance probes" (P. Kabos, U. Arz, and D.F. Williams), IEEE Microwave and Wireless Components Letters, vol. 14, No. 11, pp. 510-512, Nov. 2004.

[0011] "LRM Probe-Tip Calibrations with Imperfect Resistors and Lossy Lines," (D.F. Williams and R.B. Marks), 42nd ARFTG Conference Digest, pp. 32-36, Dec. 1993.

"LRM Probe-Tip Calibrations using Nonideal Standards" (Dylan F. Williams, Senior Member, IEEE and Roger B. Marks, Senior Member, IEEE), 1995.

"Characterization and Modeling of SOI RF integrated components", Morin Dehan, 2003 Thesis. Universite Catholique de Louvain, Introduction and Chapter 2.

* cited by examiner

CALIBRATED S-PARAMETER MEASUREMENTS OF A HIGH IMPEDANCE PROBE

CROSS REFERENCE TO RELATED APPLICATIONS

The subject application claims priority from U.S. Provisional Patent Application Ser. No. 60/916,788, entitled, CALIBRATED S-PARAMETER MEASUREMENTS OF A HIGH IMPEDANCE PROBE (William A. Hagerup, et al.), filed 8 May 2007, the entire contents of which are herein incorporated by reference.

FIELD OF THE INVENTION

The subject application concerns, in general, the field of test and measurement instruments, and in particular, concerns measuring S-parameters of a high impedance oscilloscope probe.

BACKGROUND OF THE INVENTION

This invention was inspired out of the de-embed probe research project that needed a calibrated method to measure the s-parameters of a high impedance probe. Since the inputs to such a probe are its pointed tips and its output is, for example, an SMA (SubMiniature version A) or a BMA (Blind Mate A) connector, it is not possible to use standard vector network analyzer calibration kits. Thus, a special fixture and algorithm method are needed in order to perform the required measurements. Heretofore, probe manufacturers, such as Tektronix, Inc., only measured the response of probes by use of a test fixture terminated in a 50 ohm impedance. However, this method does not incorporate error correction to remove the fixture effects and the measurement errors. What is needed is an apparatus and a method that overcomes these limitations.

The only published articles in the prior art on the subject of measuring s-parameters of a high impedance probe, of which the subject inventors are aware, were published by NIST (National Institute of Standards and Technology). For example, "Wideband Frequency-Domain Characterization of High-Impedance Probes," (U. Arz, H. C. Reader, P. Kabos, and D. F. Williams), 58th ARFTG Conference Digest, pp. 117-124, Nov. 29-30, 2001, reports an investigation of broadband microwave properties of high-impedance probes designed for on-wafer waveform measurements. The report shows that the standard two-tier characterization method fails, and introduces two new methods of characterization.

Also, "Calibrated waveform measurement with high-impedance probes," (P. Kabos, H. C. Reader, U. Arz, and D. F. Williams), IEEE Trans. Microwave Theory and Tech., vol. 51, no. 2, pp. 530-535, February 2003 is a report describing the development of an on-wafer waveform calibration technique that combines a frequency-domain mismatch correction to account for the effects of the probe on the measurement with an oscilloscope calibration. The authors state that the mismatch correction is general and can be applied to any type of microwave probe, including scanning and internal-node probes for noninvasive integrated-circuit tests. The authors also state that, for the commercial high-impedance probe we used, their calibration approach allows accurate on-wafer waveform reconstruction for a variety of probe ground configurations.

The above-described NIST calibrations use probe substitution at the end of a transmission line. The substituted probe must have the same footprint as the original RF probe or additional errors will be introduced. The subject inventors note that transmission line end effects are yet another source of error.

"Measuring the invasiveness of high-impedance probes," (U. Arz, P. Kabos, and D. F. Williams), 7th IEEE Workshop on Signal Propagation on Interconnects., Siena, Italy, May 11-14, 2003, reports the use of on-wafer measurements to characterize the invasiveness of high-impedance probes over a broad frequency range. The authors state that a two-port representation characterizing the invasiveness of the probe can also be determined from a calculation of the probe's load impedance, which is derived from a separate characterization of the high-impedance probe.

The above-described paper uses an indirect approach to quantify probe loading at point on a transmission line using multiple 2-port measurements to construct a Probe Invasiveness Error box. This error box is a 2-port model that is inserted into the transmission line model to account for the probe loading. The paper establishes that a probe's input impedance corresponds to the 2-port invasiveness model inserted into a transmission line but no probe transfer response characteristics are determined.

NIST has developed a frequency-domain method of characterizing high impedance probes suitable for performing noninvasive on-wafer waveform and signal-integrity measurements. In this regard, "Calibrating On-Wafer Probes to the Probe Tips," (D. F. Williams and R. B. Marks), 40th ARFTG Conference Digest, pp. 136-143, December 1992 states that conventional ANA calibrations are founded upon the assumption that only a single mode exists at the calibration reference plane, both during calibration and measurement. On-wafer probe tip calibrations clearly violate this assumption due to the discontinuity at the probe/wafer contact. This prior art reference describes moving the reference plane of a TRL calibration to the end of the transmission line to calibrate at the probe tip. The subject inventors note that these probes are Microwave-type RF probes, not normally used in oscilloscope probing. The physical construction of this type of probe causes problems when trying to probe in the middle of a transmission line. They are normally used to probe at the end of a line. There have problems with end effects when moving the reference plane to the end of a line and calibrating. The field is not the same as in the center of a transmission line where it is uniform TEM.

"Multiport investigation of the coupling of high-impedance probes" (P. Kabos, U. Arz, and D. F. Williams), IEEE Microwave and Wireless Components Letters, vol. 14, no. 11, pp. 510-512, November 2004, describes an on-wafer measurement technique that combines two-port and three-port frequency-domain mismatch corrections in order to characterize the influence of a high-impedance probe on a device under test. The procedure quantifies the probe's loading of the circuit, and the coupling between the probe and the device.

"LRM Probe-Tip Calibrations with Imperfect Resistors and Lossy Lines," (D. F. Williams and R. B. Marks), 42nd ARFTG Conference Digest, pp. 32-36, December 1993, received a "Best Paper Award". This prior art reference states that the line-reflect-match calibration is extended, without significant loss of measurement accuracy, to accommodate imperfect match standards and lossy lines typical of monolithic microwave integrated circuits. The authors characterized the match and line standards using an additional line standard of moderate length.

They stated that their new method provided a practical means of obtaining accurate, wideband calibrations with compact standard sets.

In, "LRM Probe-Tip Calibrations using Nonideal Standards" (Dylan F. Williams, Senior Member, IEEE and Roger B. Marks, Senior Member, IEEE), the authors state that the line-reflect-match calibration is enhanced to accommodate imperfect match standards and lossy lines typical of monolithic microwave integrated circuits. They further stated that they characterized the match and line standards using an additional line standard of moderate length. They claimed that their new method provided a practical means of obtaining accurate, wideband calibrations with compact standard sets, and that without that enhancement, calibration errors due to imperfections in typical standards could be severe.

None of the above-mentioned prior art references recognize the need to duplicate a typical probing environment in which there are no probe pads or transmission line end effects to be compensated.

SUMMARY OF THE INVENTION

The calibration technique described herein connects the probe under test to a point in the center of a transmission line instead the end of the transmission line and establishes a reference plane on the fixture at the tips of the probe under test. Advantageously, a Vector Network Analyzer (VNA), cable and fixture imperfections are characterized during calibration of the fixture. The extracted error coefficients are then uploaded to the VNA to obtain corrected 2-port probe S-parameters from probe tip to coax output. Combinations of the following elements form a method for a probe and oscilloscope equalization filter control arrangement that allows a user to specify the nominal source impedance of the probe DUT for the filter design.

A Test Fixture circuit board: This test fixture contains multiple length transmission lines that are used as part of the characterization measurements and algorithms. It may contain pads at the end of the lines for connection to RF microprobes that connect to a vector network analyzer. Alternatively the lines may be terminated with 2.92 mm or other types of connectors for direct interface to the vector network analyzer.

Mechanical fixture support and probe positioning hardware: The fixture and probe that is to be measured must be supported by the appropriate positioners and mechanical environment.

Vector Network Analyzer: A vector network analyzer (VNA) is connected to the fixture and performs the error corrected measurements that will be used to generate the desired S-parameters of the high impedance probe. The procedure requires many measurements of the fixture reference traces and of the DUT to obtain the needed data.

Multiport Measurement Software/Hardware: A multiport VNA or Matrix Switchbox box is used for multiport measurements for various steps of the fixture calibration and probe measurement procedure.

The probe to be measured: The probe to be measured will be connected to the network analyzer through appropriate connection to the test fixture board and the output connector of the probe.

DSP Algorithms: Extensive math algorithm processing of the measured data is required in order to obtain the final measured S-parameters for the probe.

It is herein recognized that uniform transmission lines in the Probe Fixture must be used. It is also herein recognized that the Differential Probe Fixture must be mirror top-bottom symmetric. No other method currently exists to obtain calibrated S-parameters of a probe from the probe tip.

DETAILED DESCRIPTION OF THE EMBODIMENTS

Figure 1:
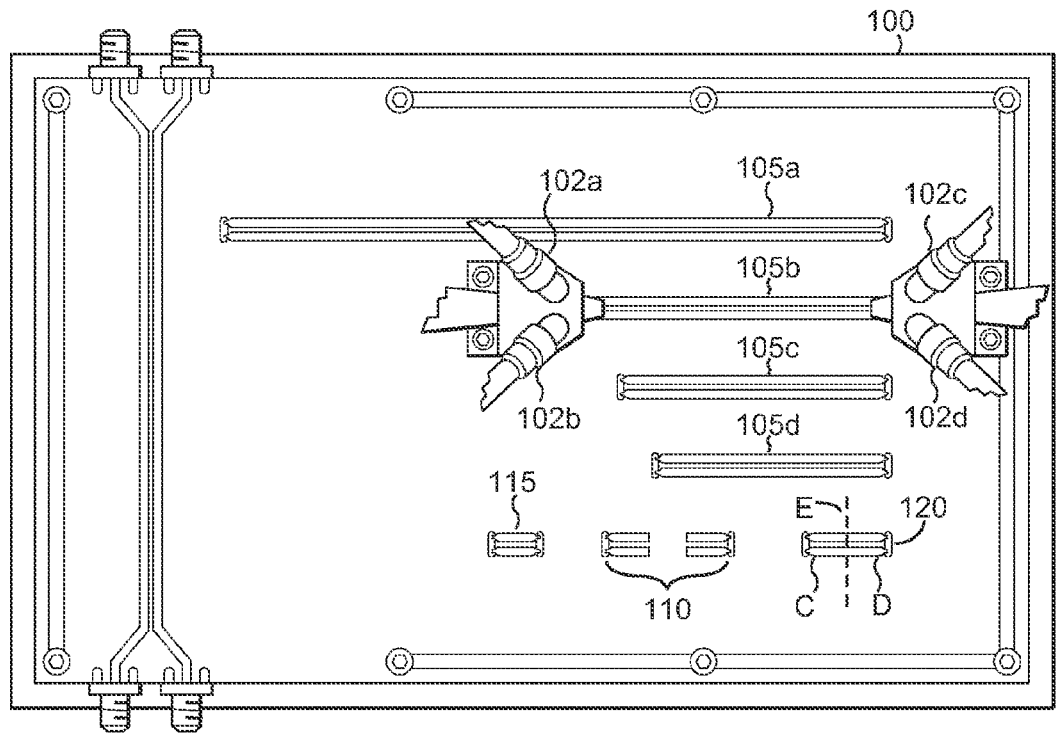
FIG. 1 shows a drawing of a test fixture in accordance with the subject invention.

The subject invention concerns method for the measuring the S-parameters of a high impedance probe. A previous methodology published by NIST was not adequate for the measurement of active high impedance probes such as those manufactured by Tektronix, Inc. of Beaverton, Oreg. This invention provides a new methodology and algorithm that allows Tektronix for the first time to obtain the full two port s-parameter set for the high impedance probe. The measured probe s-parameters are then used for characterization of probes. Heretofore, such technology and procedure did not exist. FIG. 1 is an example of a fixture setup in accordance with the subject invention. Characterization of a coaxial DUT requires a set of characterized coaxial standards. These can be purchased in the form of a "CalKit" (i.e., Calibration Kit) for most connector types. No off-the-shelf CalKit exists for the probe tip environment. A custom calibration structure must be generated and characterized to match the probe tip environment. The most useful calibration structure should match the most typical probing environment. A planar transmission line structure meets that criterion.

A fixture 100 with a microstrip 105 or CPW (CoPlanar Waveguide) transmission line for probing is the near ideal probe calibration environment. This invention uses this environment and characterizes it to act as a calibration standard much like a coaxial CalKit. The fixture characterization process generates error correction coefficients that are used in the measurement process to obtain corrected, 2-port probe s-parameters.

Figure 2:
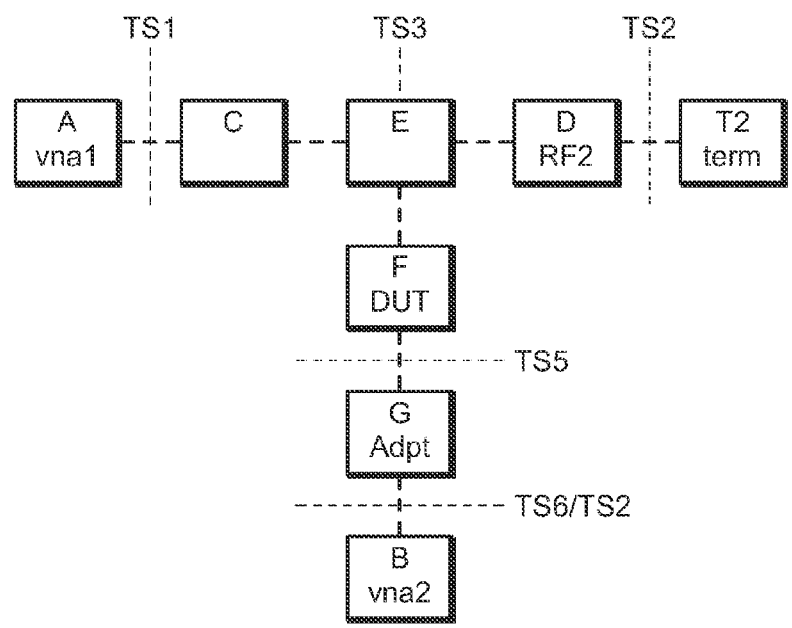
FIG. 2 is block diagram of a Probe Calibration/Measurement System

FIG. 2 shows a single-ended view of a high level block diagram of a Probe Calibration/Measurement System. To characterize a Probe, a calibrated Probe Fixture (100 of FIG. 1) must be provided. Referring to FIG. 2, the following text is a description of a procedure to calibrate the PCB probe fixture, measure the probe and extract its corrected s-parameters. In FIG. 2:

Element A is Port1 of the VNA including coax cable.
Element B is Port2 of the VNA including coax cable
Element C is the Left half of the PCB THRU microstrip Line and launch.
Element D is the Right half of the PCB THRU microstrip Line and launch
Element E is the Measurement point on the PCB microstrip—Virtual 3—port.

Element F is the Device Under Test (DUT), or more precisely, the Probe Under Test.
Element G is the TekConnect® connectorAdapter Box (BMA to SMA)
Element T2 is a Coaxial Termination.

The blocks shown in FIG. 2 represent the electrical characteristics or Error Boxes of the VNA, cables, PCB fixture including connectors and launches, DUT (probe under test), and TekConnect Adapter Box.

Referring again to FIG. 1, elements C, D, and E that were defined above are shown in connection with the PCB test fixture 100. The cables 102a, 102b, 102c, and 102d (collectively 102) of the differential probes of vna 1 are shown mounted on PCB test fixture 100.

The Probe, F, is characterized by
 a. Launching a signal from A (vna1) at TS1 onto a Terminated microstrip line 105 on a PCB fixture 100;
 b. Sampling of the signal by the Probe as it contacts the microstrip line 105 at Reference Plane TS3 (E);
 c. Measuring the Probe output at TS6; and
 d. Applying de-embedding math To obtain a calibrated Probe measurement, all of the Error Boxes shown above must be characterized. That is, the fixture 100 must be calibrated first. With all of the Error Box parameters known, the signals at the Probe tip and Probe output can accurately be determined.

Because the probe tip is not in a coaxial environment, a special calibration procedure is necessary to establish a calibration Reference Plane at TS3 on the PCB microstrip line 105 for the probe input.

Fixture Characterization
Tier1 Calibration

Figure 3:
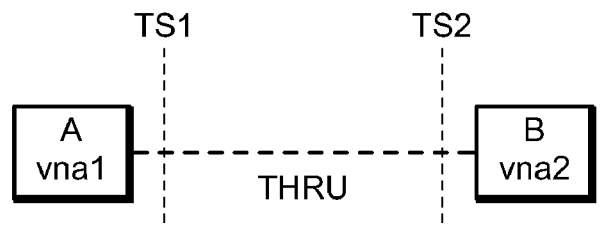
FIG. 3 shows a block diagram representation useful in understanding the subject invention.

Referring to FIG. 3, Error Boxes A and B consist of the VNA and coaxial cables that are used to connect to the Thru-Reflect-Load (TRL) Fixture 100. The Error Boxes are characterized using Short-Open-Load-Reflect (SOLR) calibration. With Coaxial Calibration Standards and an Unknown (reciprocal) THRU connection between the cables, Error Boxes A and B are characterized and the measurement Reference Planes TS1 and TS2 are established.

This Tier1 SOLR calibration is used to establish a THRU calibration at TS1 and TS2 that is needed later when measuring the Active Probe. One skilled in the art will note that any appropriate 2-port coaxial calibration technique can be substituted at this step.

Tier2 Calibration

Figure 4:
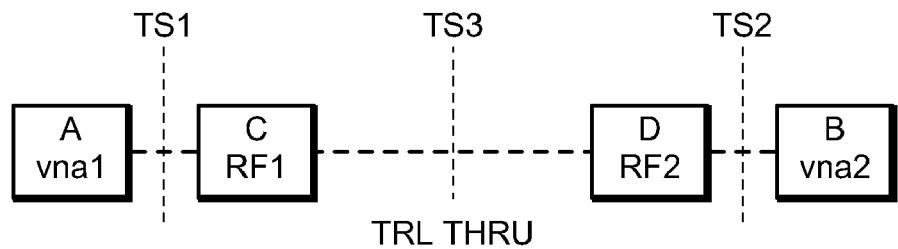
FIG. 4 shows a block diagram representation useful in understanding the subject invention.

Referring to FIG. 4, Tier 2 TRL Characterization of the C and D Error Boxes of the Probe Calibration Fixture is used to characterize the Probe Calibration Fixture 100 which will be used for taking Probe measurements. After calibration, the TRL THRU Calibration Standard becomes the Probe Calibration Fixture.

Referring again to FIG. 4, Error Boxes C and D each consist of cables and/or other interconnects and a pair of a PCB launches.

Figure 5:
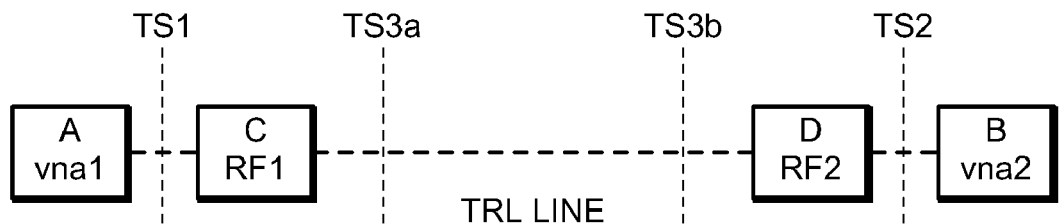
FIG. 5 shows a block diagram representation useful in understanding the subject invention.
Figure 6:
FIG. 6 shows a block diagram representation useful in understanding the subject invention.

Referring to FIGS. 5 and 6, Error Boxes C & D are characterized between reference planes TS1-TS3 and TS2-TS3 using the TRL calibration procedure. Several TRL Calibration Standards, THRU 120, Line(s) 105a, 105b, 105b, and 105d (collectively 105), Reflects 110 and Load(s) 115, are fabricated on the PCB test Fixture 100 and measured to complete the TRL calibration. The LOAD measurement is a part of TRL calibration and is used to establish the Characteristic Impedance of the THRU and LINE standards which then allows for the correct renormalization of S-parameters to 50 ohms for the Error Boxes and subsequently for the probe measurements.

TRL calibrations always include a method of establishing the characteristic impedance of the THRU and LINE to convert the S-parameters to a 50 ohm reference. Without the renormalization all of the S-parameters of the error boxes are referenced to Zo, the Characteristic Impedance of the line (instead of 50 ohm) and that Characteristic Impedance is unknown unless additional steps are taken.

A method of establishing Zo, Characteristic Impedance includes the following steps:
  a. Measure LOAD s-parameters;
  b. Determine Resistance of transmission line (for high resistance lines);
    NIST provides a program called CAP to convert either step a or step b above to a DC capacitance, which is then used to establish Zo.
  c. Apply Load method;
  d. Apply Open method;
  e. Apply LL method;
Steps c, d, and e are detailed in "Characterization and Modeling of SOI RF integrated components", Morin Dehan, 2003 Thesis. Universite Catholique de Louvain, herein incorporated by reference.
  f. Apply Capacitance difference Method (after the probe calibration work.)

The TRL calibration establishes the TS3 measurement Reference Plane on the microstrip THRU line. This THRU line now becomes our Probe Calibration Fixture. After calibration the signal at the reference plane TS3 of the Probe Calibration Fixture can be accurately determined. This is exactly the environment needed and used for making calibrated probe tip measurements.

After calibration the signals at the reference planes TS3*a* and TS3*b* can be accurately determined from measurements at the vna1 and vna2 ports. Any 2-port DUT inserted between TS3*a* and TS3*b* can be accurately measured.

Up to this point the 2-tier SOLR and TRL calibrations and de-embed procedures detailed above are fairly standard for characterizing 2-port DUTS (i.e., devices under test) that can be inserted between the reference planes TS3*a* and TS3*b* of the fixture. For the calibration to be effective, the DUT inputs/output must interface precisely to the fixture transmission line structure at TS3, in this case, that structure is a microstrip line. Unfortunately, a high impedance scope probe tip does not meet this criterion. The probe tip presents a poor match to the planar transmission line structure. End effects from the truncated transmission line are indistinguishable from the probe tip parasitics. Clearly, trying to insert a probe as a 2-port DUT into this calibration fixture introduces significant discontinuities and compromises accurate measurement of the probe. Moreover, calibrating a probe at the end of a transmission line does not match the normal probing environment.

Previous probe calibration methods have either attempted to calibrate the probe at the end of a "calibrated" line, or have simply placed the probe near the center of a 2-port terminated, but uncalibrated fixture. Both methods generate errors in the probe calibration process.

In the real world, most probe measurements are made by contacting runs (i.e., traces) on a printed circuit board (PCB) or on a package. This is the desired probe environment that probe calibration should target.

An embodiment of the subject invention introduces a third port to the 2-port Probe Fixture to provide probe calibration in the desired probing environment. The previously calibrated 2-port Probe Fixture can be mathematically expanded from a 2-port to a 3-port fixture. This expanded 3-port fixture is able to accommodate the probe tip/fixture interconnect without introducing any fixture parasitics.

Figure 7:
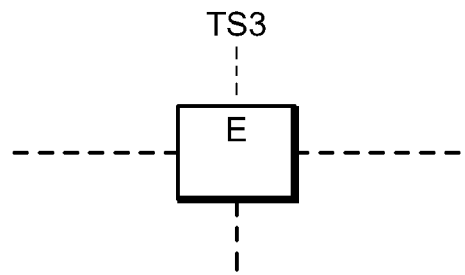
FIG. 7 shows a block diagram representation useful in understanding the subject invention.

Construction of the expanded 3-port fixture begins with the 2-port Probe Fixture. Referring to FIG. 7, a 3-port error box, E, is mathematically inserted into the transmission line at reference plane TS3. This E error box represents a single infinitesimal point at TS3 where the DUT Probe tip will make contact with the microstrip line 105.

Characterization of E Error Box

This Error Box is easily characterized by inspection as an ideal 3-port junction.

S-parameters of an ideal 3port point junction with equal Zref at all ports:

$$\begin{pmatrix} sE11_i & sE12_i & sE13_i \\ sE21_i & sE22_i & sE23_i \\ sE31_i & sE32_i & sE33_i \end{pmatrix} := \begin{pmatrix} \frac{-1}{3} & \frac{2}{3} & \frac{2}{3} \\ \frac{2}{3} & \frac{-1}{3} & \frac{2}{3} \\ \frac{2}{3} & \frac{2}{3} & \frac{-1}{3} \end{pmatrix}$$

One skilled in the art will recognize that other 3-port representations can be substituted to compensate for a probe socket or other probe fixture features, if needed.

Touching the probe tip to the transmission line does introduce a discontinuity, but this discontinuity is 100% attributable to probe input loading. The fixture 100 introduces no measurement parasitics or discontinuities. And, since the probe tip is at a calibration reference plane, the conditions at the probe tip are precisely known and calibrated probe S-parameters can be extracted from the raw measurements.

Reduced 3port Error Box Er

Figure 8:
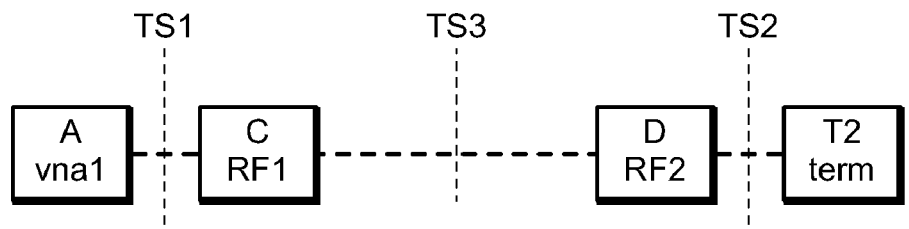
FIG. 8 shows a block diagram representation useful in understanding the subject invention.

The Probe Calibration fixture configuration is now that of a 3-port fixture, but the Probe measurement must be reduced to a 2-port result. This is done by absorbing one of the Probe Calibration Fixture arms into the 3-port Error Box E, converting it into a 2-port (reduced 3-port) fixture, Er. The arm to the right of the 3-port is chosen to be absorbed. Because the VNA will be connected between TS1 and TS6 during probe measurements, the port at TS2 is terminated with Load T2. To properly characterize the arm with the T2 termination, its reflection, $\lceil ts3$, as seen from TS3 must be determined. This is accomplished in 2 steps:

Referring to FIG. 8, at TS1, measure the reflection $\lceil ts1$ of this 2-port network (the original 2-port Probe Fixture with termination T2 at port 2).

Figure 9:
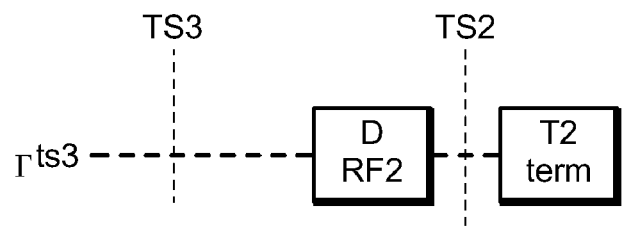
FIG. 9 shows a block diagram representation useful in understanding the subject invention.

Then reduce to representation shown in FIG. 9 by de-embedding the C Error Box, which is known from the earlier TRL calibration to obtain $\lceil ts3$, the reflection seen at TS3 due to D and T2.

Figure 10:
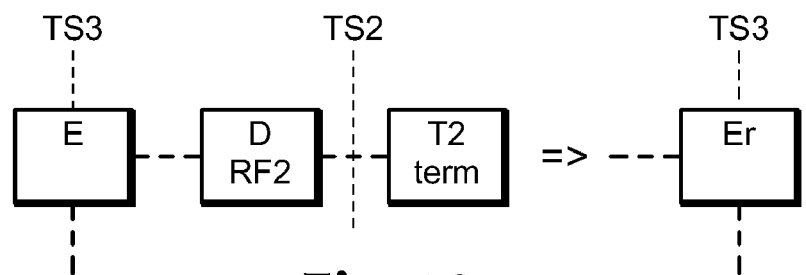
FIG. 10 shows a block diagram representation useful in understanding the subject invention.

$\lceil ts3$ is then used to reduce the 3-port E network to the 2-port network Er, as shown in FIG. 10.

S-Parameter Calculations for the Reduced 3-Port, Er.

The original 3-port Error Box E is converted to a 2-port Error Box Er by modifying the original Error Box E s-parameters with the right arm reflection coefficient, $\lceil ts3$.

$$\begin{pmatrix} sEr11 & sEr11 \\ sEr11 & sEr11 \end{pmatrix} = \begin{pmatrix} sE11 + \frac{sE13 \cdot sE31 \cdot \lceil ts3}{1 - sE33 \cdot \lceil ts3} & sE12 + \frac{sE13 \cdot sE32 \cdot \lceil ts3}{1 - sE33 \cdot \lceil ts3} \\ sE21 + \frac{sE23 \cdot sE31 \cdot \lceil ts3}{1 - sE33 \cdot \lceil ts3} & sE22 + \frac{sE23 \cdot sE32 \cdot \lceil ts3}{1 - sE33 \cdot \lceil ts3} \end{pmatrix}$$

1-Port Expanded Error Box, Dx

Alternative Method to the Reduced 3-port Error Box, Er

The earlier method introduces a third port to the 2-port Probe Fixture to provide probe access to the probe fixture The original method expanded the 2-port fixture into a 3-port model to accommodate the connection of the probe tip to the fixture.

An alternative method concentrates on characterizing the right half of the fixture and termination as a 1-port and expanding it into a 2-port error box. This 2-port error box can now be cascaded with the probe input.

Figure 11:
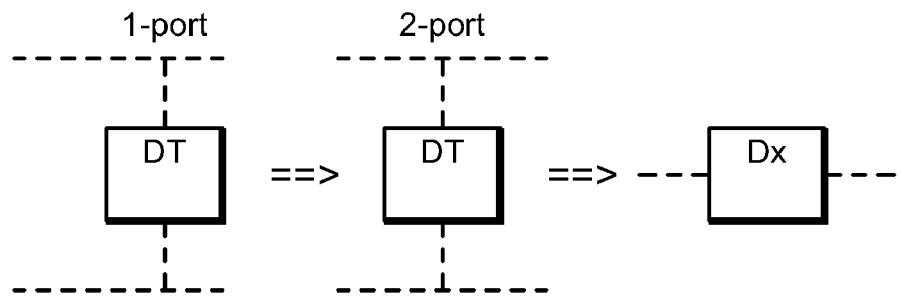
FIG. 11 shows a block diagram representation useful in understanding the subject invention.

Expansion of the 1-port is illustrated below in the Expanded 1-port Error Box Method. If a network can be represented as a shunt impedance only (and a 1-port network qualifies), then that network can be expanded to a 2-port network. The 1-port network, DT, is expanded into the 2-port network, Dx, as shown in FIG. 11.

Figure 12:
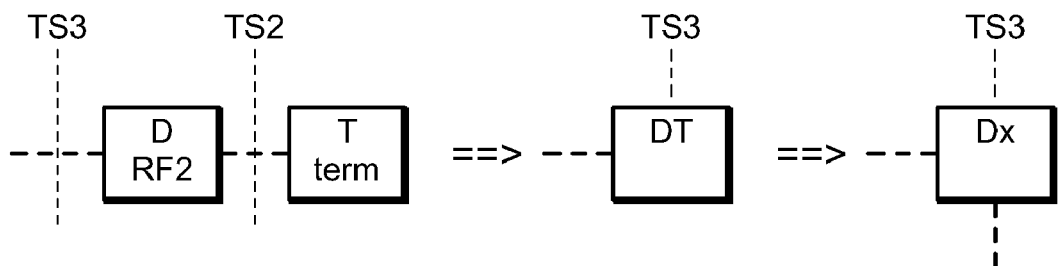
FIG. 12 shows a block diagram representation useful in understanding the subject invention.

Using the above technique this portion of the Probe Calibration fixture is converted to the 1-port network, DT and expanded to this 2-port matrix, Dx, as shown in FIG. 12.

S-Parameter Calculations for the Expanded 1-Port, Dx.

The S-parameters of the original 1-port Error Box DT are converted to 2-port S-parameters sDx by the following:

$$sDx = \begin{pmatrix} sDx11 & sDT12 \\ sDx21 & sDT22 \end{pmatrix} = \begin{pmatrix} \frac{sDT11-1}{sDT11+3} & 2 \cdot \frac{sDT11+1}{sDT11+3} \\ 2 \cdot \frac{sDT11+1}{sDT11+3} & \frac{sDT11-1}{sDT11+3} \end{pmatrix}$$

(The variable sDT11 used here is the same as ⌈ts3 used earlier).

Figure 13:
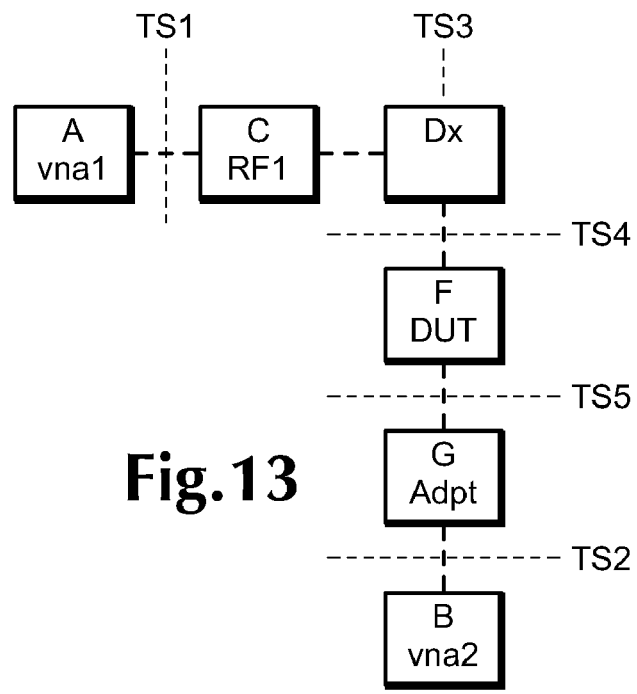
FIG. 13 shows a block diagram representation useful in understanding the subject invention.

Now the probe can be cascaded with the output port of Dx. and the results are identical to those obtained using the reduced 3-port method, as shown in FIG. 13.

Characterizing the TekConnect® Probe Interface Adapter Box, G.

Figure 14:
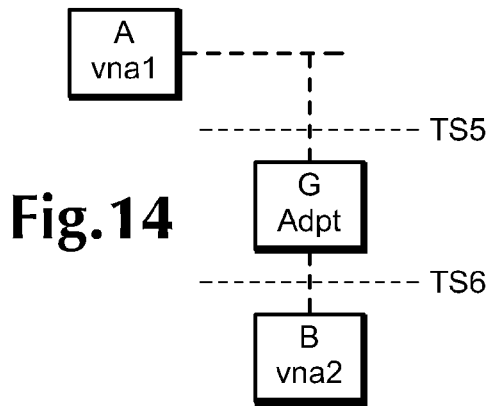
FIG. 14 shows a block diagram representation useful in understanding the subject invention.

Referring to FIG. 14, the final step is to measure and characterize the TekConnect® Probe Interface Adapter box (BMA to SMA). Standard coaxial S-parameter measurement and de-embedding procedures are used here.

Final Measurement Configuration

Figure 15:
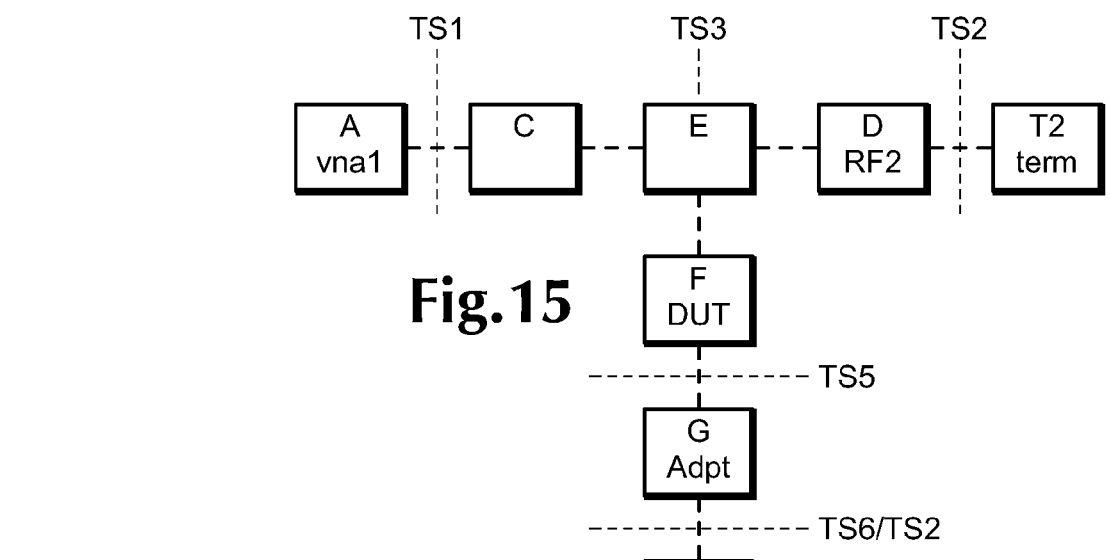
FIG. 15 shows a block diagram representation useful in understanding procedure to calibrate the test fixture of FIG. 1 in accordance with the subject invention.
Figure 16:
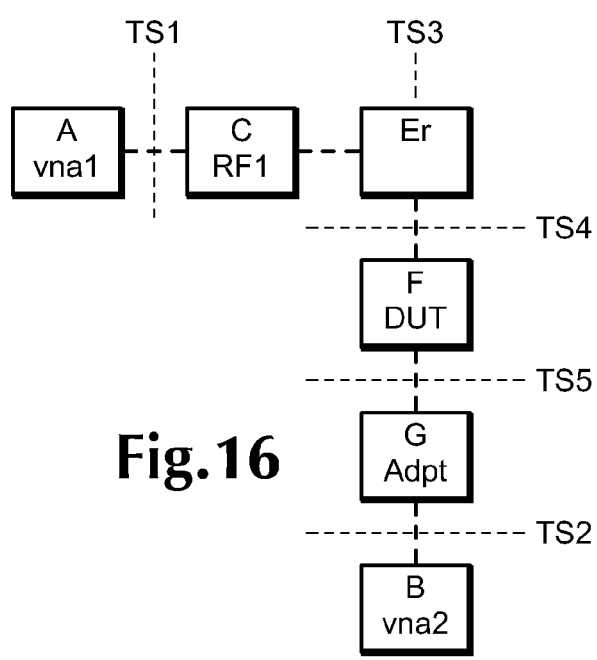
FIG. 16 shows a block diagram representation useful in understanding the subject invention.

Referring to FIGS. 15 and 16, we now have a complete probe measurement configuration. Box F represents the probe 2-port S-parameters, and Box G is the TekConnect® Probe Interface Adapter box (BMA to SMA).

All of the Error Boxes have now been characterized via the previous calibration procedures. FIG. 15 represents the physical configuration; FIG. 16 represents the mathematical equivalent. For clarity, it should be noted that Er in FIG. 16 is, in fact, the same as Dx.

Measurements of the Probe and THRU portion of the Probe Calibration Fixture are made between TS1 and TS2 with the tier-1 calibrated VNA. The probe characteristics are mathematically extracted from the tier-1 measurements by de-embedding Error Box C (determined from the TRL calibration), Error Box Er described above, and Error Box G, the Probe TekConnect Interface Adapter Box, characterized in a separate procedure. When all the error boxes from the fixture are de-embedded from the measurement, a calibrated set of S-parameters are extracted for the probe from probe tip to output connector.

Differential Probe and Probe Calibration Fixture Characterization

A procedure similar to that for characterizing a Single Ended Probe and Probe Calibration Fixture above is used to characterize the Differential Probe and Probe Calibration Fixture. The Differential Probe Calibration Fixture has twice as many ports as the Single Ended Probe Calibration Fixture and it now supports 2 modes, Differential and Common Mode. In addition to requiring multiport VNA equipment and techniques for characterizing this fixture, a 4-port TRL fixture calibration is required. Unfortunately, current software and algorithms available for the TRL calibration only support calibration of 2-port networks.

A method in accordance with an embodiment of the invention was developed using Modal decomposition to mathematically:

a. convert each of the 4-port TRL Calibration Standards into a pair of, 2-port Standards, Differential & Common Mode;

b. process the data set from the 2-port Differential Mode Standards and the 2-port Common Mode Standards separately using a 2-port TRL calibration program;

c. process the 2 sets of TRL results beginning with step 3 above, "Characterization of E Error Box"; and d. convert the physical 4-port Differential Probe Calibration Fixture into a pair of virtual 2-port Single Mode Probe Calibration Fixtures:

e. using the Differential Mode Probe Calibration Fixture for calibrating the probe's differential mode response and f. use the Common Mode Probe Calibration Fixture for calibrating the probe's common mode response.

Throughout the characterization and calibration process, 4-port S-parameter data from each Probe Calibration Fixture calibration step is separated into 2 sets, Differential and Common Mode. After all the TRL standards have been measured, each Mode is then processed separately, using the characterization process outlined above for Single Ended probes.

The Probe Calibration fixture characterization process generates both Common Mode and Differential Mode error correction coefficients that are used in the final calibration step to obtain corrected, 3-port S-parameters for a differential probe. Both Differential and Common Mode performance of the differential probe is extracted.

The mixed mode matrix presents the S-parameter data in terms of Differential and Common Mode Stimulus and Response.

Mixed Mode Matrix $$\begin{pmatrix} sdd11 & sdd12 & sdc11 & sdc12 \\ sdd21 & sdd22 & sdc21 & sdc22 \\ scd11 & scd12 & scc11 & scc12 \\ scd21 & scd22 & scc21 & scc22 \end{pmatrix} =$$

$$\begin{array}{cc} & \begin{array}{cc} \textit{Diff } \text{Mode} & \textit{Com } \text{Mode} \\ \text{Stimulation} & \text{Stimulation} \end{array} \\ \begin{array}{c} \textit{Diff } \text{Mode} \\ \text{Response} \end{array} & \begin{pmatrix} sdd11 & sdd12 \\ sdd21 & sdd22 \end{pmatrix} \begin{pmatrix} sdc11 & sdc12 \\ sdc21 & sdc22 \end{pmatrix} \\ \begin{array}{c} \textit{Com } \text{Mode} \\ \text{Response} \end{array} & \begin{pmatrix} scd11 & scd12 \\ scd21 & scd22 \end{pmatrix} \begin{pmatrix} scc11 & scc12 \\ scc21 & scc22 \end{pmatrix} \end{array}$$

The pure Differential Mode components, sdd11, sdd12, sdd21, sdd22 occupy the upper left quadrant of the Mixed-Mode matrix. The pure Common Mode components, scc11, scc12, scc21, scc22 are in the lower right quadrant.

The other 2 quadrants contain the mode-conversion or cross-mode S-parameters, such as, sdc entries which describe the conversion of Common Mode signals into Differential Mode; and scd entries which describe the conversion of Differential Mode signals into Common Mode.

Differential View

The detailed process for characterization of a Differential Probe Calibration Fixture is as follows. To characterize a differential Probe, a calibrated Differential Probe Calibration Fixture must be provided. A fixture, using a pair of microstrip or CPW transmission line for differential probing, is the near ideal calibration environment. This invention uses this environment and characterizes it to act as a calibration standard much like a coaxial Cal Kit. What follows is the description of a procedure to calibrate a symmetric, differential PCB probe fixture, use it to measure the probe and extract the probe's corrected s-parameters, as shown in FIG. 17.

Figure 17:
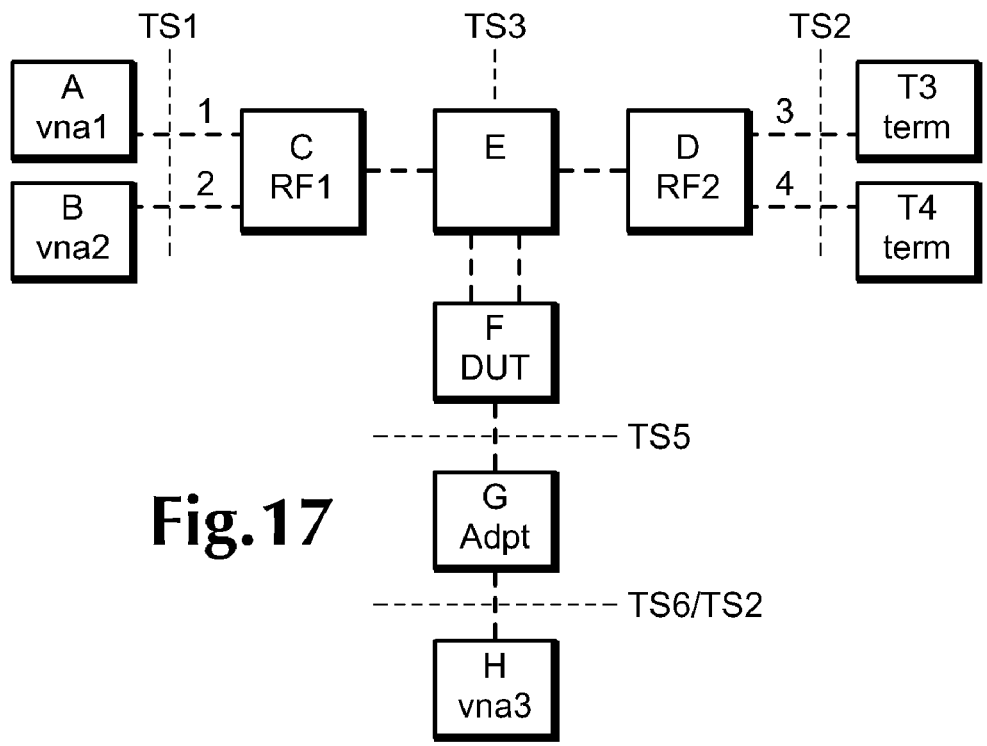
FIG. 17 shows a block diagram representation useful in understanding the procedure to calibrate a symmetric, differential Probe Calibration fixture, in accordance with subject invention.

In FIG. 17:
Element A is Port1 of VNA+coax cable;
Element B is Port2 of VNA+coax cable;
Element C is the Left half of PCB THRU Line and launch;
Element D is the Right half of PCB THRU Line and launch;
Element E is the Measurement point on PCB microstrip—Virtual 6—port;
Element F is the device under test (DUT), or more precisely the Probe Under Test;
Element G is a TekConnect® probe to SMA Adapter Box;
Element H is Port3 of VNA+coax cable
Element T3 is a Coaxial Termination; and
Element T4 is a Coaxial Termination.

These blocks (i.e., elements) represent the electrical characteristics or Error Boxes of the VNA, cables, Probe Calibration fixture including connectors and launches, DUT (probe under test), and TekConnect® Probe Adapter Box.

Referring to FIG. 17, the Differential Probe, F, is characterized by
  a. Launching a signal from A (vna1) and B (vna2) at TS1 onto a Terminated microstrip line 105 on a Probe Calibration fixture 100;
  b. Sampling of the signal by the Probe as it contacts the microstrip line 105 at Reference Plane TS3 (E);
  c. Measuring the Probe output at TS6; and
  d. Applying deembedding math.

To obtain calibrated Probe measurement, all of the Error Boxes shown above must be characterized, i.e., the fixture must be calibrated first. With all of the Error Box parameters known, the signals at the Probe tip and Probe output can accurately be determined and the differential probe characteristics extracted.

Because the probe tip is not in a coaxial environment, a special calibration procedure is necessary to establish a calibration Reference Plane at TS3 on the PCB microstrip line 105 (Differential Probe Fixture 100) for the probe input.

Figure 18:
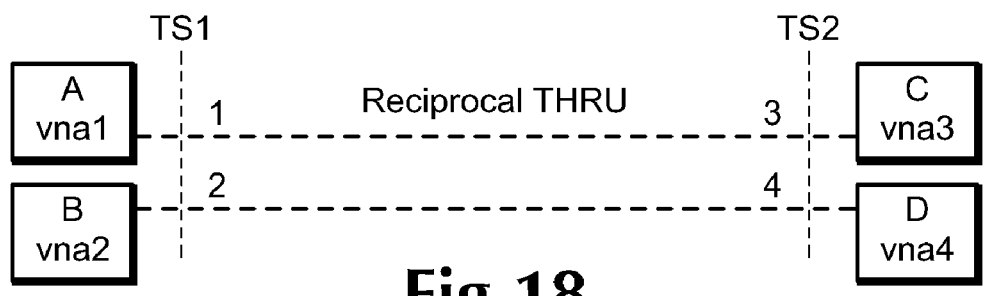
FIG. 18 shows a block diagram representation useful in understanding the subject invention.

Differential Probe Calibration Fixture Characterization
Tier1 Differential Calibration Referring to FIG. 18, Tier1 Characterization of A, B, C and D Error Boxes will be described. Error Box A, B, C and D consist of the VNA ports and interconnecting coaxial cables for measuring the Probe Calibration Fixture. The Error Boxes are characterized using SOLR calibration. With Coaxial Calibration Standards and Reciprocal THRU connections between all the ports, Error Boxes A, B, C & D are characterized and the tier1 measurement Reference Planes TS1 and TS2 are established. One skilled in the art will recognize that any appropriate 4-port coaxial calibration technique can be substituted for this step.

The Tier1 multiport SOLR calibration is used to establish calibration reference planes at TS1 and TS2 that are needed for measuring the Active Probe later.

Figure 19:
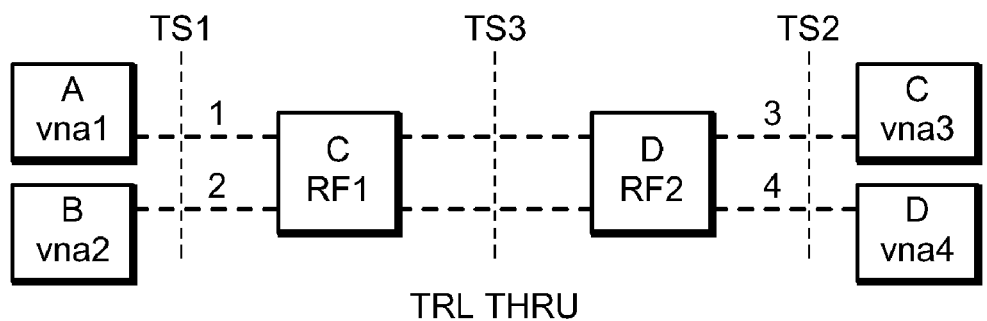
FIG. 19 shows a block diagram representation useful in understanding the THRU Calibration Standard as used in the subject invention.
Figure 20:
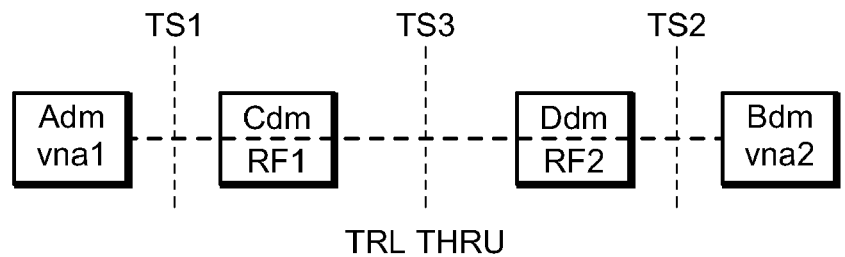
FIG. 20 shows a block diagram representation useful in understanding the THRU Calibration Standard as used in the subject invention.
Figure 21:
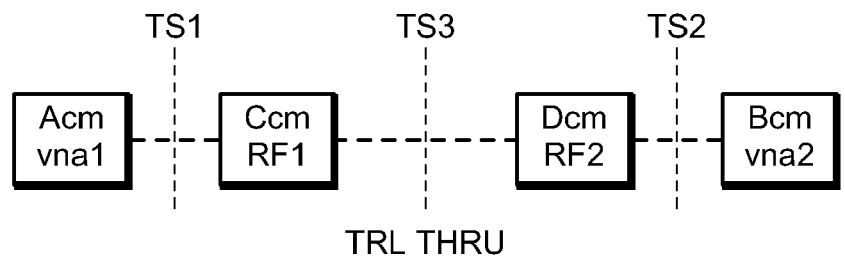
FIG. 21 shows a block diagram representation useful in understanding the THRU Calibration Standard as used in the subject invention.
Figure 22:
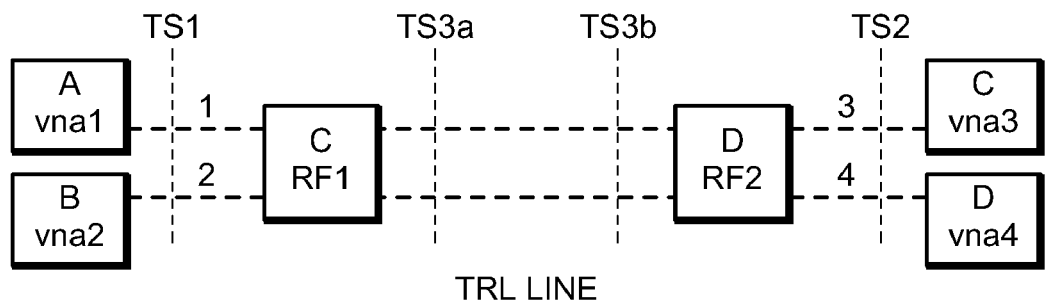
FIG. 22 shows a block diagram representation useful in understanding the LINE Calibration Standard as used in the subject invention.
Figure 23:
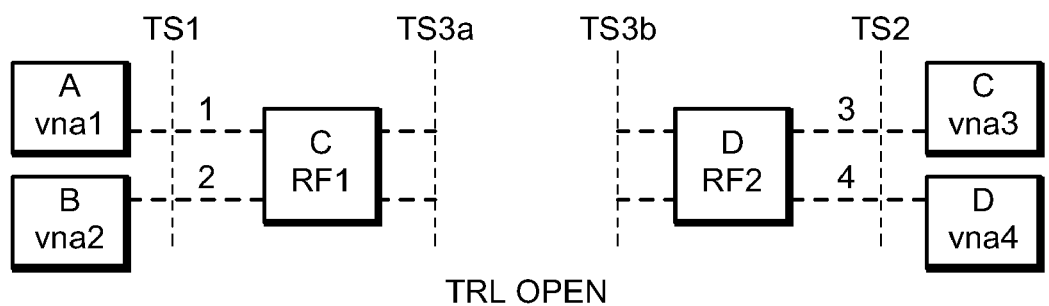
FIG. 23 shows a block diagram representation useful in understanding the REFLECT Calibration Standard as used in the subject invention.

Tier2 Differential Calibration
Tier 2 Characterization of C and D Error Boxes using TRL Calibration Several Differential Standards are required for a TRL calibration:
  a. THRU
  b. LINE (1 or more)
  c. OPEN THRU Calibration Standard is shown in FIGS. 19, 20, and 21. LINE Calibration Standard is shown in FIG. 22, and the Reflect Calibration Standard is shown in FIG. 23.

S-parameter measurements of each of the 4-port TRL standards are converted to a pair of virtual 2-port TRL standards, a Differential Mode Standard and a Common Mode Standard using Modal decomposition. The S-parameters of these virtual standards are then processed by the 2-port TRL calibration program.

Each of the TRL Calibration Standards is measured as a 4-port device using the tier-1 calibration established in Step 1 above. This requires either a 4-port VNA or if using a 2-port VNA, a set of 6 S-parameter measurements for each TRL Standard.

Each TRL Calibration Standard is represented by a 4×4 array of measured S-parameters. Each 4-port TRL Standard results in a 4×4 S-parameter matrix (at each frequency). These matrices are then mathematically converted to the Mixed Mode Matrix format for each TRL Standard. The Mixed Mode Matrix transforms the 4×4 S-parameter matrix of each TRL Standard into 4 subarrays of the different modes: Differential Mode (DM), Common Mode (CM) and 2 Cross Modes. For Standards with top-bottom symmetry, the Cross Mode components will be zero leaving only the Differential and Common Mode entries.

The mixed mode matrix presents the s-parameter data in terms of Differential and Common Mode Stimulus and Response.

Mixed Mode Matrix $$\begin{pmatrix} sdd11 & sdd12 & sdc11 & sdc12 \\ sdd21 & sdd22 & sdc21 & sdc22 \\ scd11 & scd12 & scc11 & scc12 \\ scd21 & scd22 & scc21 & scc22 \end{pmatrix} =$$

$$\begin{array}{cc} & \begin{array}{cc} \textit{Diff} \text{ Mode} & \textit{Com} \text{ Mode} \\ \text{Stimulation} & \text{Stimulation} \end{array} \\ \begin{array}{c} \textit{Diff} \text{ Mode} \\ \text{Response} \end{array} & \begin{pmatrix} sdd11 & sdd12 \\ sdd21 & sdd22 \end{pmatrix} \begin{pmatrix} sdc11 & sdc12 \\ sdc21 & sdc22 \end{pmatrix} \\ \begin{array}{c} \textit{Com} \text{ Mode} \\ \text{Response} \end{array} & \begin{pmatrix} scd11 & scd12 \\ scd21 & scd22 \end{pmatrix} \begin{pmatrix} scc11 & scc12 \\ scc21 & scc22 \end{pmatrix} \end{array}$$

The pure Differential Mode components, sdd11, sdd12, sdd21, sdd22 occupy the upper left quadrant of the Mixed-Mode matrix. The pure Common Mode components, scc11, scc12, scc21, scc22 are in the lower right quadrant.

The other 2 quadrants contain the mode-conversion or cross-mode S-parameters, such as sdc entries which describe the conversion of Common Mode signals into Differential Mode and scd entries which describe the conversion of Differential Mode signals into Common Mode.

When the Cross Mode terms are zero, the Differential and Common Mode S-parameter subarrays for the each Standard can be extracted from the Mixed Mode matrix as inputs for 2-port TRL Calibration processing. For each TRL Standard, a set of S-parameters for Differential Mode and another set for Common Mode are input separately into the 2-port TRL Calibration program (currently MultiCal/StatistiCAL from NIST), resulting in 2, 2-port Calibration Sets that represent the 4-port THRU portion of the Probe Calibration Fixture. The above process effectively reduces a 4-port fixture to two, 2-port fixtures, one fixture for each mode.

Probe Calibration Standard

Figure 24:
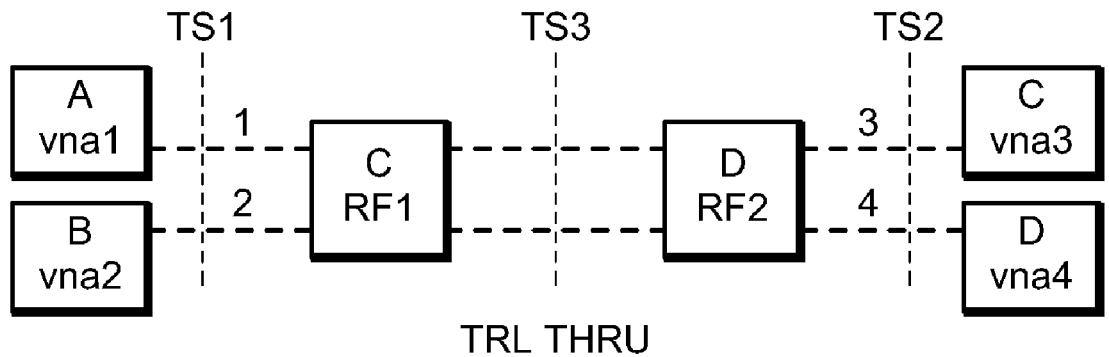
FIG. 24 shows a block diagram representation useful in understanding the subject invention.
Figure 25:
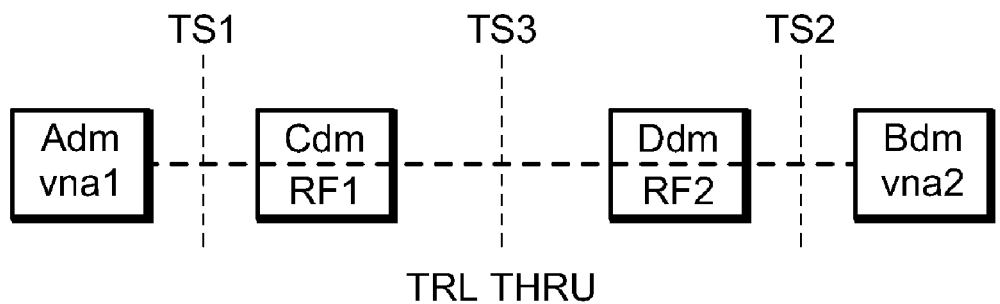
FIG. 25 shows a block diagram of a probe calibration standard in accordance with the subject invention.
Figure 26:
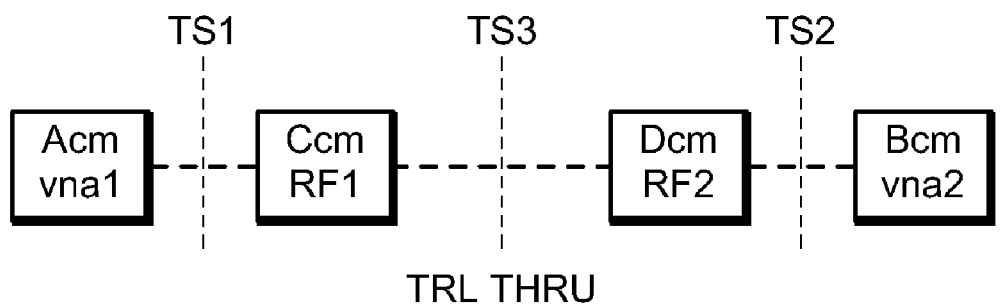
FIG. 26 shows a block diagram of a probe calibration standard in accordance with the subject invention.

A pair of Virtual 2-port Probe Calibration Standards is generated from the Physical Differential Probe Calibration Standard using Modal Decomposition is shown in FIG. 24. The Virtual Probe Calibration Standard—Differential Mode is shown in FIG. 25, and the Virtual Probe Calibration Standard—Common Mode is shown in FIG. 26. The Virtual Probe Calibration Standards are used to characterize the probe's Differential Mode and Common Mode response.

Final Differential Measurement Configuration

Figure 27:
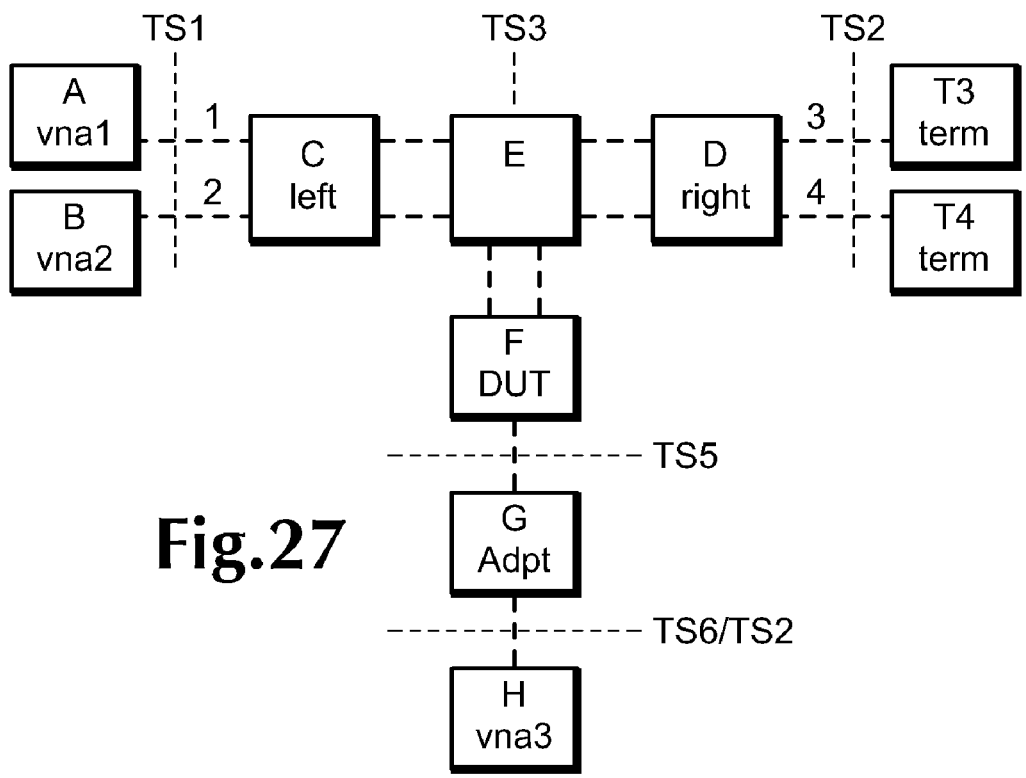
FIG. 27 shows a block diagram representation of the physical configuration for measuring a differential probe in accordance with the subject invention.

Referring to FIG. 27, we now have a complete probe measurement configuration. Box F represents the probe's 3-port s-parameters, and Box G is the TekConnect® Probe Interface Adapter box (BMA to SMA). All of the Error Boxes have now been characterized via the previous calibration procedures.

The Differential Probe measurements are 3-port measurements but will be separated into Differential and Common Mode for processing. Measurements of Probe in the Probe Calibration Fixture are made between TS1 and TS6 with the tier-1 calibrated VNA. The 3-port measurements are transformed into Differential and Common Mode.

Figure 28:
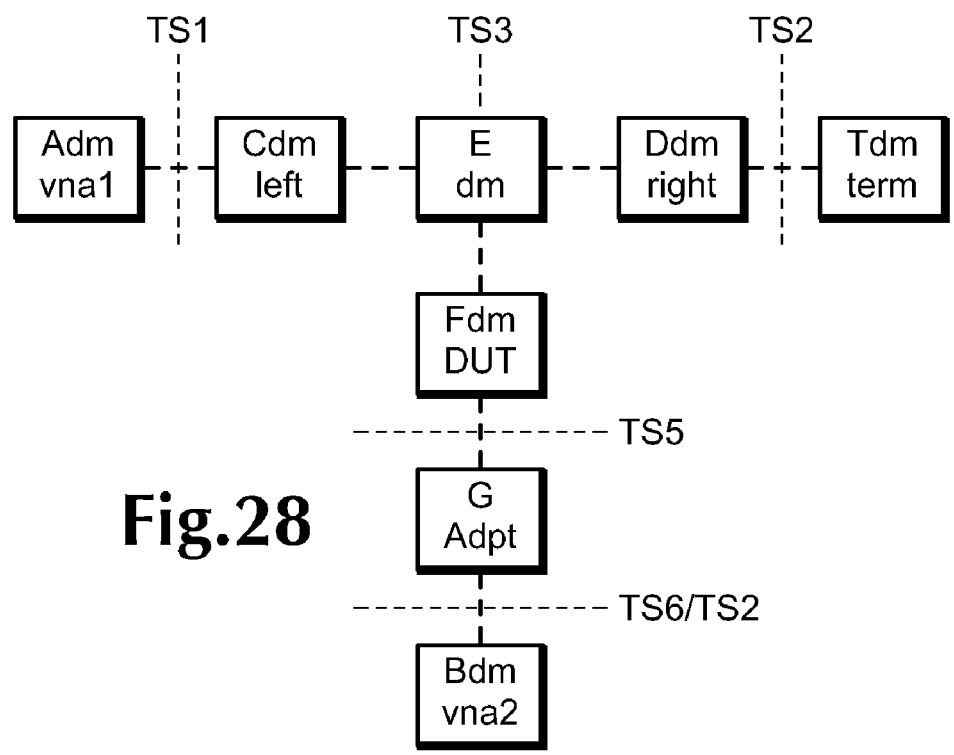
FIG. 28 shows a block diagram representation of the virtual configuration for making differential mode measurements of a differential probe in accordance with the subject invention
Figure 29:
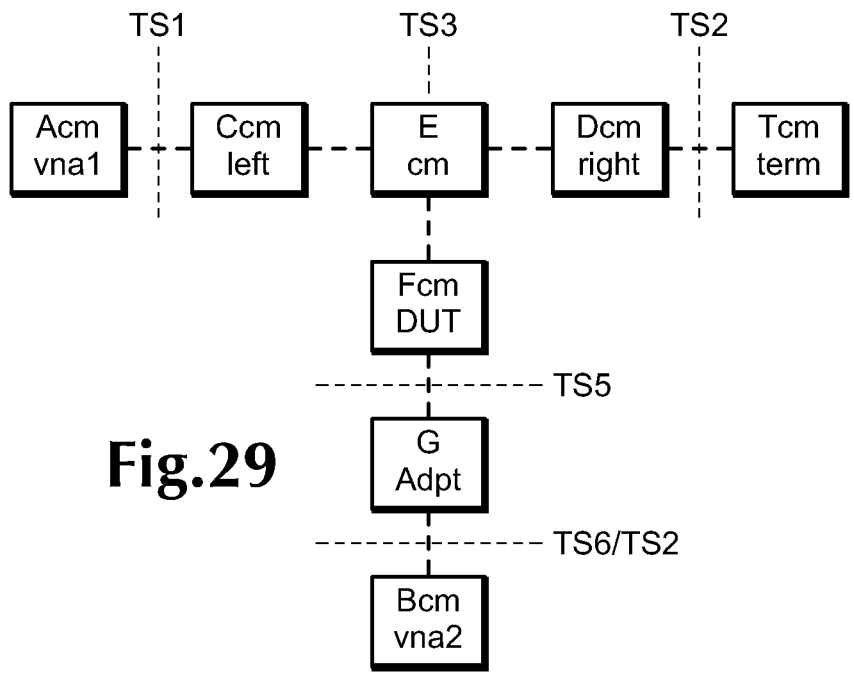
FIG. 29 shows a block diagram representation of the physical configuration for making common mode measurements of a differential probe in accordance with the subject invention

FIG. 27 represents the physical configuration for measuring the Differential Probe. FIGS. 28 and 29 represent the virtual measurement configurations for the Differential and Common Modes, respectively.

Figure 30:
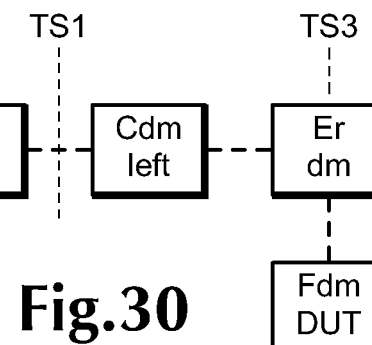
FIG. 30 shows a mathematical representation for extracting Probe Differential Mode characteristics in accordance with the subject invention.
Figure 31:
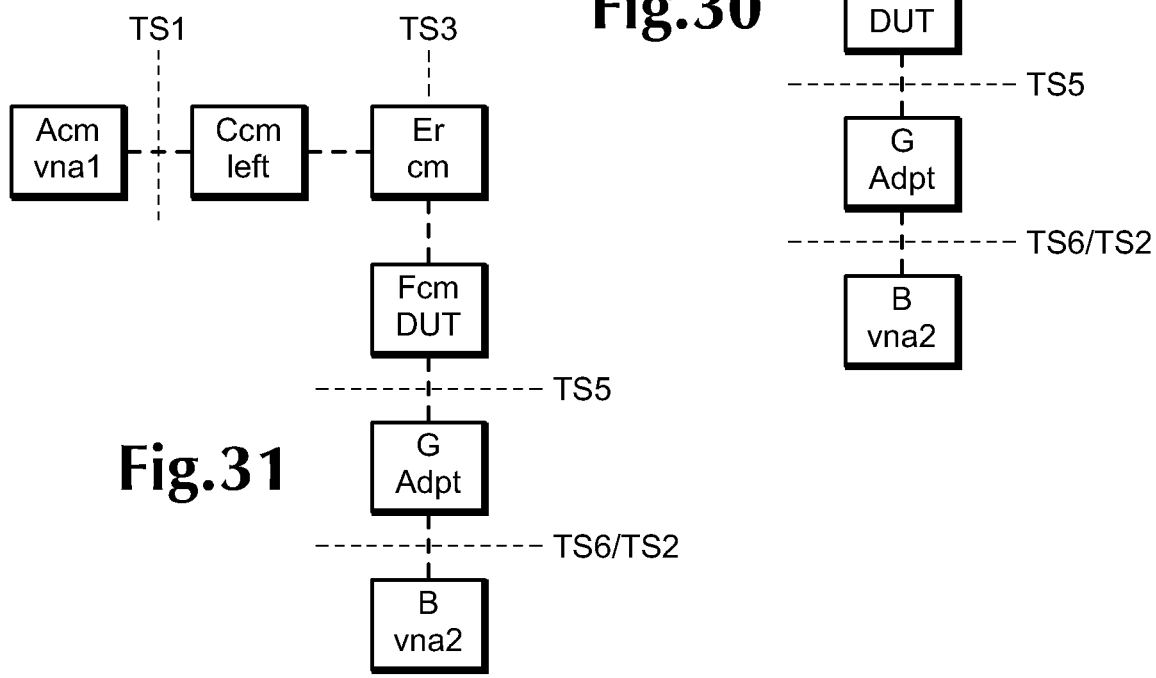
FIG. 31 shows a block diagram representation useful in understanding the subject invention.

FIG. 30 is the mathematical representation for extracting the Probe Differential Mode characteristics. FIG. 31 represents the mathematical extraction of the Probe Common Mode characteristics.

The probe characteristics are mathematically extracted from the tier-1 measurements on a Differential Mode and Common Mode basis by de-embedding Error Box C (determined from the TRL calibration), Error Box Er described above, and Error Box G, the Probe TekConnect® Probe Interface Adapter Box, characterized in a separate procedure.

When all the error boxes from the fixture are de-embedded from the measurement, a calibrated set of Differential Mode and Common Mode S-parameters are extracted for the probe from probe tip to output connector.

Calibration Verification

Features Added to Verify Fixture Calibration.

S11 Verification.

Figure 32:
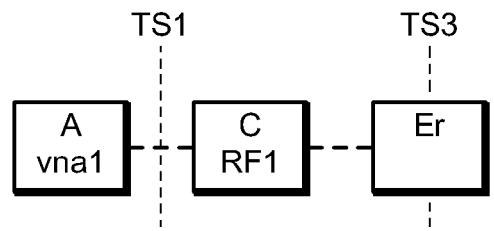
FIG. 32 shows a block diagram representation useful in understanding the subject invention.
Figure 33:
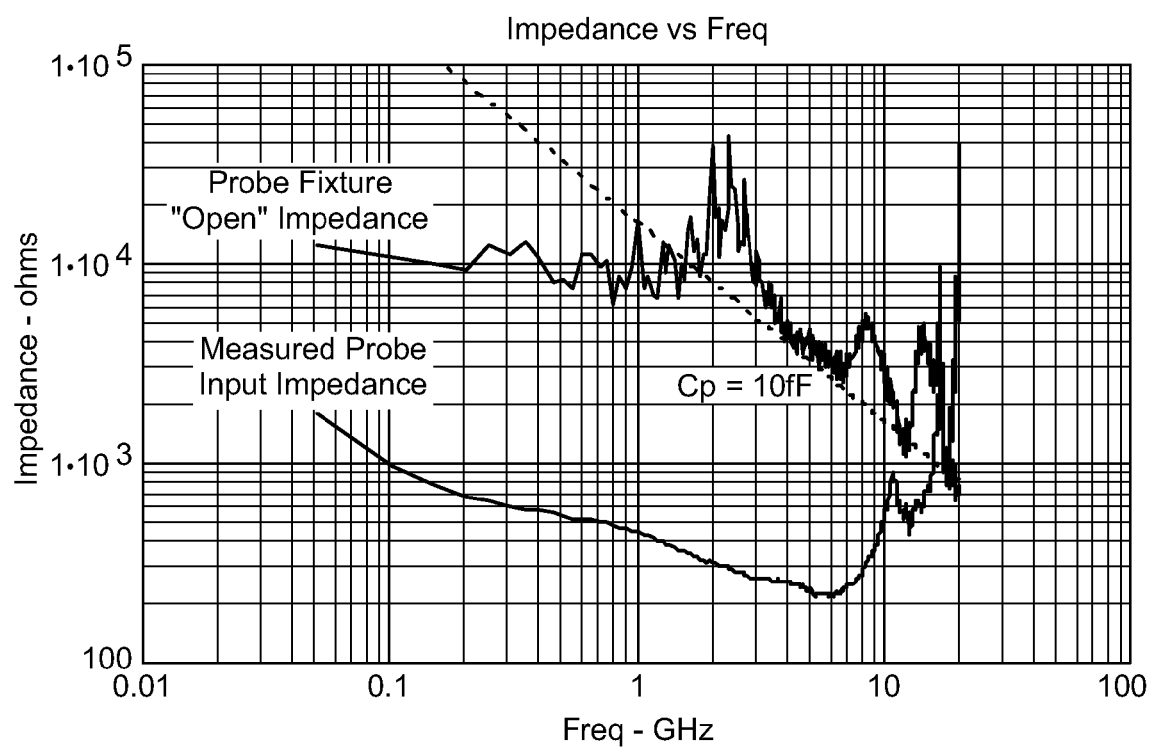
FIG. 33 shows a graph useful in understanding the subject invention.

Referring to FIG. 32, a corrected s11 measurement at the TS3 reference plane without the probe present will theoretically appear as a perfect open. Since the fixture is a uniform transmission lines at TS3 there are no parasitic transmission line end effects (excess capacitance) to compensate for. Any deviation from a perfect open will be due only to calibration errors. Typically s11 is converted to Zin at TS3. At low frequencies, an "open-circuit" impedance between 10 k ohms to 200 k ohms is typical. In most cases, "open-circuit" impedance will begin to fall at a break frequency dependent on fixture and calibration accuracy. Typical S11 Verification Results for Differential Probe Calibration Fixture (Differential Mode) are shown in the graph of FIG. 33.

Calibration Verification

S21 Verification

Figure 34:
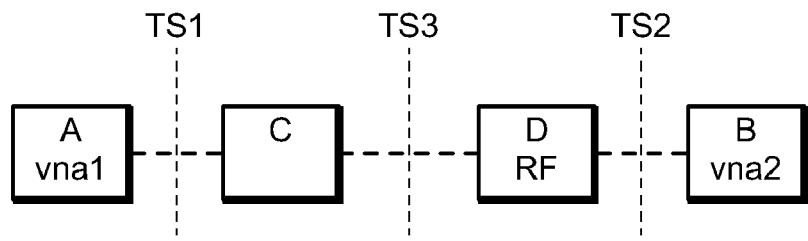
FIG. 34 shows a block diagram representation useful in understanding the subject invention.
Figure 35:
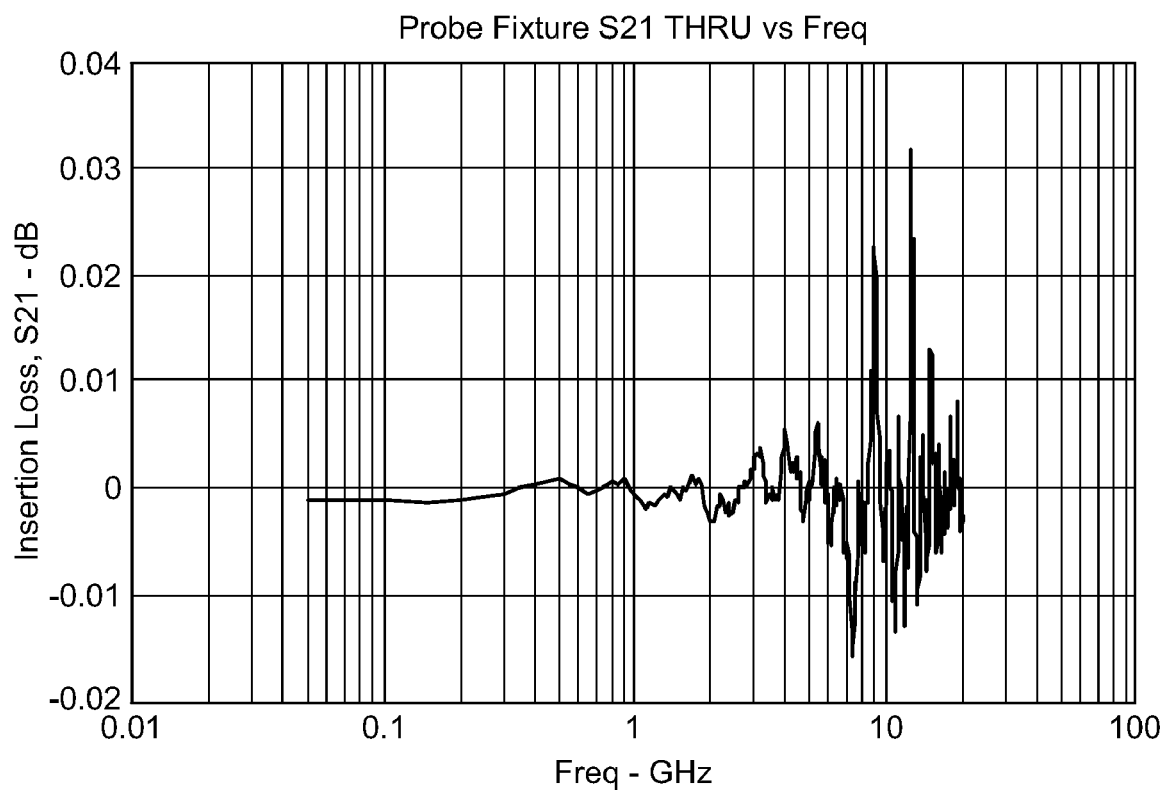
FIG. 35 shows a graph useful in understanding the subject invention.

Referring to FIG. 34, the corrected s21 gain of the Probe Fixture is ideally 0 db and can be checked by de-embedding the measurement of the 2-port Probe Calibration Fixture between TS1 and TS2. S21 Thru Errors of the Probe Calibration Fixture after calibration are often 0.05 db or less. Typical S21 Verification Results for Differential Probe Calibration Fixture (Differential Mode) are shown in FIG. 35.

There has been presented, a rigorous, detailed method to obtain calibrated 2-port S-parameters measurements of a high impedance probe. Previously, there has been no adequate way to make traceable calibrated probe measurements.

The need to measure the S-parameters of probes is now becoming a very key competitive factor in the industry. It will be used as the foundation to create new technology such as the de-embed probe. It will be used to characterize standard probes and compute correction filters for equalization of them.

Instead of the SOLR calibration procedure used in the previous description, Short-Open-Load-Thru (SOLT) or other coaxial calibration procedures can be used. The TRL calibration procedure used in the subject description can be replaced by the SymmetriCAL™ procedure described in PCT patent application number PCT/US2007/075485 entitled, CALIBRATION OF SYMMETRIC AND PARTIALLY SYMMETRIC FIXTURES (Doubrava, et al.), filed 8 Aug. 2007, and published as WO2008/021907 on 21 Feb. 2008, and herein incorporated by reference, or by another calibration procedure that will establish a calibration reference plane on the structure being probed.

What is claimed is:

1. A method of measuring S-parameters of a probe under test, comprising the steps of:
providing a calibrated PCB test fixture;
connecting a probe to a terminated microstrip line, formed on said calibrated test fixture, at a third reference plane TS3 (E) of said calibrated PCB test fixture;
launching a signal from an input terminal (vna1) at a first reference plane TS1 onto said terminated microstrip line on said calibrated PCB fixture;
sampling said signal received by said probe as it contacts said microstrip line at said third reference plane TS3 (E);
measuring an output signal of said probe at a sixth reference plane TS6; and
applying de-embedding math to said output signal to extract the S-parameters of the probe under test.

2. The method of claim 1 wherein the step of providing a calibrated PCB test fixture, comprises the steps of:
establishing a THRU calibration at said first reference plane TS1 and a second reference plane TS2 by use of a SOLR calibration;
characterizing error boxes by a TRL calibration procedure, said error boxes comprising cables or interconnects and PCB launches; wherein
a first error box RF1 is situated between said first reference plane TS1 and said third reference plane TS3 and a second error box RF2 is situated between said second reference plane TS2 and said third reference plane TS3.

3. The method of claim 2, wherein
said calibrated PCB test fixture comprises TRL calibration standards including THRU, LINE, REFLECT, and LOAD.

4. A method of measuring S-parameters of a differential probe under test, comprising the steps of:
providing a calibrated PCB test fixture;
connecting a probe to a terminated microstrip line, formed on said calibrated PCB test fixture, at a third reference plane TS3 (E) of said calibrated PCB test fixture;
launching a first signal from a first input terminal (vna1) and a second signal from a second input terminal (vna2) at a first reference plane TS1 onto said terminated microstrip line on said calibrated PCB test fixture;
sampling said signal received by said probe as it contacts said microstrip line at said third reference plane TS3 (E);
measuring an output signal of said probe at a sixth reference plane TS6; and applying de-embedding math to said output signal to extract the S-parameters of the differential probe under test.

5. The method of claim 4 wherein the step of providing a calibrated PCB test fixture, comprises the steps of:

establishing a THRU calibration at a first input terminal (vna1), of said calibrated test fixture, at said first reference plane TS1 and at a first output terminal (vna3) at a second reference plane TS2 by use of a SOLR calibration;

establishing a THRU calibration at a second input terminal (vna2) at said first reference plane TS1 and at a second output terminal (vna4) at a second reference plane TS2 by use of a SOLR calibration;

characterizing error boxes by a TRL calibration procedure, said error boxes comprising cables or interconnects and PCB launches; wherein a first error box RF1 is situated between said first reference plane TS1 and said third reference plane TS3 and a second error box RF2 is situated between said second reference plane TS2 and said third reference plane TS3.

6. The method of claim 5, wherein
said calibrated PCB test fixture comprises TRL calibration standards including THRU, LINE, OPEN, and LOAD.

7. The method of claim 6, wherein
said step of characterizing said error boxes by said TRL process includes the steps of:

performing said characterization using said THRU calibration standard;

performing said characterization using said LOAD calibration standard;

performing said characterization using said LINE calibration standard; and performing said characterization using said OPEN calibration standard.

* * * * *